United States Patent [19]

Matisoo

[11] 3,803,459

[45] Apr. 9, 1974

[54] GAIN IN A JOSEPHSON JUNCTION

[75] Inventor: Juri Matisoo, Yorktown Heights, N.Y.

[73] Assignee: General Instrument Corporation, Newark, N.J.

[22] Filed: Apr. 27, 1973

[21] Appl. No.: 354,977

Related U.S. Application Data

[63] Continuation of Ser. No. 194,077, Oct. 27, 1971, abandoned, which is a continuation of Ser. No. 771,101, Oct. 28, 1968, abandoned.

[52] U.S. Cl. ....... 317/234 T, 317/234 R, 317/234 S, 307/306

[51] Int. Cl. .......... H01l 5/06

[58] Field of Search ....... 317/234 S, 234 T; 307/306

[56] References Cited

UNITED STATES PATENTS

| | | | |
|---|---|---|---|
| 3,458,735 | 7/1969 | Fiske | 307/306 |
| 3,521,133 | 7/1970 | Beam | 317/234 |

OTHER PUBLICATIONS

Gregos–Hansen et al., Solid State Communications, Vol. 7, pp. 1215–1218, 1969.

Scolapino et al., Physical Review Letter, Vol. 20, No. 6, April 15, 1968, p. 859.

Goldman et al., Physical Review, Vol. 164, No. 2, Dec. 10, 1967, pp. 544–547.

*Primary Examiner*—Martin H. Edlow
*Attorney, Agent, or Firm*—Jackson E. Stanland

[57] ABSTRACT

The Josephson junction, which can be used as a superconductive switching element, comprises two metal superconductors that are separated by a barrier which can be the oxide of one of the metals. It has been found that current gains in such a junction can be greatly enhanced when the ratio of the penetration depth $\Lambda_J$ of the junction to the length L of the junction is $<<1$.

29 Claims, 6 Drawing Figures

INVENTOR
JURI MATISOO

BY [signature]
ATTORNEY

GAIN IN A JOSEPHSON JUNCTION

This is a continuation, of application Ser. No. 194,077 filed Oct. 27, 1971, which is in turn a continuation of application Ser. No. 771,101, filed Oct. 28, 1968, both now abandoned.

BACKGROUND OF THE INVENTION

This invention is directed toward increasing the current gain of a device employing a Josephson junction as the gate in that device, the characteristics of such junction being described in detail in a publication by the inventor entitled "The Tunneling Cryotron—A Superconductive Logic Element Based on Electron Tunneling" which appeared in the *Proceedings of the IEEE*, Feb. 1967, Vol. 55, No. 2, pp. 172–180. Such a device consists of a gate and a control which is positioned above but insulated from the gate. The control can be made of almost any convenient superconductor, for example, niobium, lead, in that such control always remains superconductive. The gate consists of two strips of superconducting material which overlap. In the region of the overlap, the two strips of superconductive material are separated from each other by a barrier. The barrier is usually, though not necessarily, formed by an oxide of one of the superconductor strips, wherein said barrier is of the order of 10–30 A thick. The gate and its control are normally placed on a superconductive ground plane, but insulated therefrom.

The operation of the device is based on the existence of two states for the gate (Josephson junction) and the fact that the gate can be switched from one state to the other by means of a magnetic field. One of these states is a pair tunneling state of the junction in which current can flow through the barrier region without any voltage drop. The other state is a single-particle tunneling state in which the current flows with a voltage across the junction equal to $2\Delta$, where $\Delta$ is the energy gap of the superconductor. For tin, $2\Delta \cong 1$mV at 1.7° K. The transition from one state to the other can be brought about by exceding the critical current for the Josephson junction. The critical current, $I_{J_{max}}$, is defined as the largest zero voltage current the junction can carry.

It is a peculiarity of the Josephson junction that during switching from the zero-voltage state to the voltage state, there is no transition from a superconducting state to the normal resistive state. Because the superconducting to normal phase transition is not involved and the barrier layer is so small, the transition time from zero-voltage to full voltage is of the order of subnanoseconds.

SUMMARY OF THE INVENTION

If, in the manufacture of a Josephson junction, the junction barrier thickness is chosen so that the penetration depth of the barrier is much less than the longitudinal dimension of the junction, the resulting plot of zero-voltage critical current versus magnetic field perpendicular to this longitudinal dimension yields a curve having a very steep zero-voltage critical current within a short range of magnetic field change. Thus, if the Josephson junction is biased by a magnetic field so that the critical current is at its maximum value, a small additional magnetic field will cause a large change in the critical current so that current gains of the order of 40 are obtainable.

Thus, it is an object of this invention to provide a scheme by which improved current gains can be obtained.

It is yet another object to provide a Josephson junction where the ratio of the penetration depth in the barrier to the length of such barrier is considerably less than unity.

A further object is to provide an improved Josephson junction which, when used in a logic circuit, as a memory device, etc. can yield current gains of the order of 40.

The foregoing and other objects, features and advantages of the invention will be apparent from the following more particular description of a preferred embodiment of the invention, as illustrated in the accompanying drawings.

Figure 2:
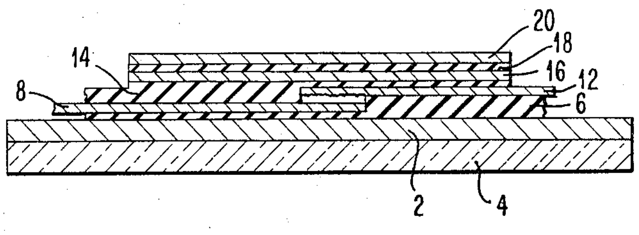
FIG. 2 is a cross-section taken along line 2—2 of FIG. 1.
Figure 3:
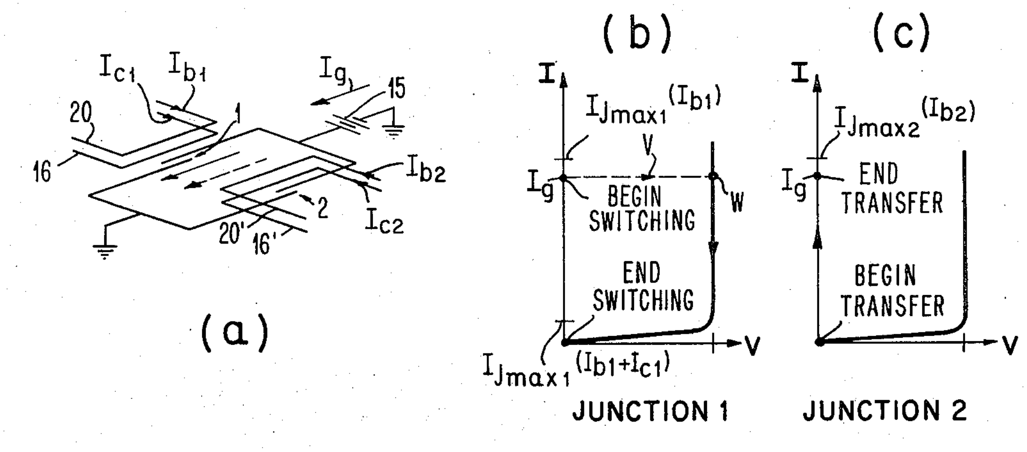
FIG. 3 illustrates the operation of two Josephson junctions in a flip-flop circuit with appropriate I-V curves for each junction.

The circuit of FIG. 3 comprises two identical junctions in parallel connected by a wholly superconducting path. Each junction comprises a superconductive ground plane 2 (see FIG. 1) deposited on a highly polished, clean substrate 4 of glass, pyrex or the like. Over the ground plane, which in this embodiment that illustrates the invention is made of a 5,000 A thick strip of lead, is deposited an insulating layer 6 (See FIG. 2 of SiO. Atop of such insulated layer is evaporated, by conventional vacuum deposition and masking techniques, a first strip 8 of superconductive material, i.e., tin, that is approximately 800 A thick. The substrate and its deposited layers are removed from the evaporator, imperfections are removed, and the two lengths, L, of the respective tin strips 8 and 8' are oxidized to produce barrier layers 10 and 10' to a thickness of about 10–30 A. After oxidation is carried out, the substrate is returned to the evaporation chamber and a second superconductive strip 12 (12') of approximately 5,000 A thick is deposited over the oxide layer 10 (10') and over insulated layer 6. In effect, each of the two strips 8 (8') and 12 (12') have a common overlap of length L, such common overlap being separated by an oxide layer of approximately 10–30 A thick. In order not to obscure the drawing of FIG. 1, the insulating layers are not shown, but are shown in the cross-sectional view of FIG. 2.

Figure 1:
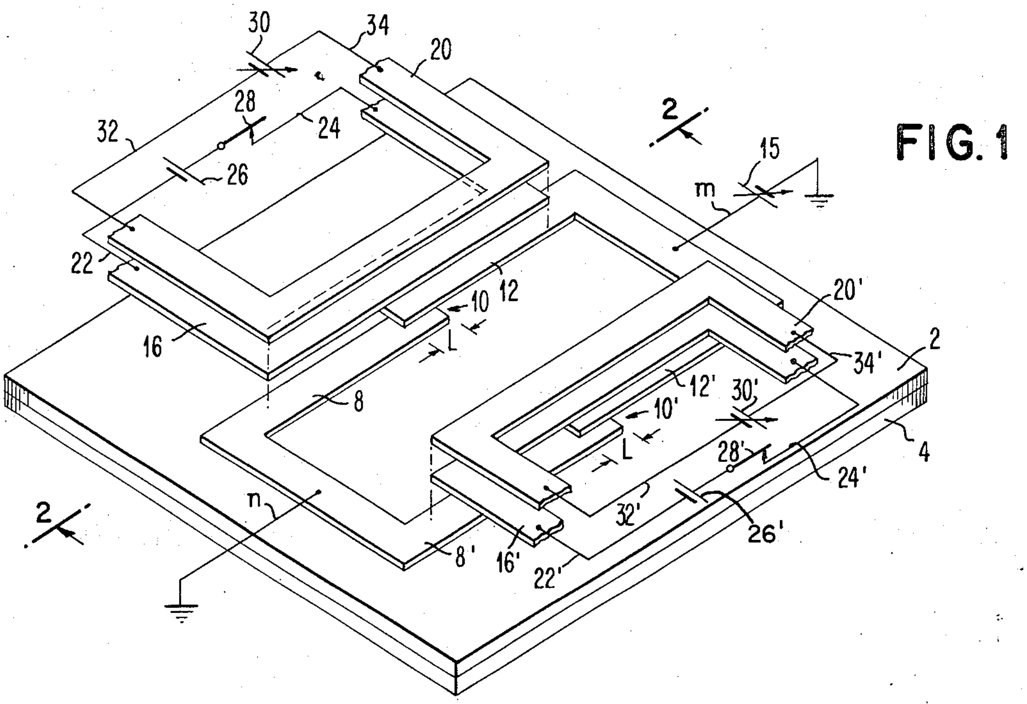
FIG. 1 is a perspective view of an embodiment of the novel Josephson junction forming the invention.

After the devices have been completed, alternate layers of SiO layer 14, tin layers 16 (16'), SiO layer 18 and tin layers 20 (20') are deposited, each of the layers being of the order of 5,000 A in thickness. Suitable leads 22 (22') and 24 (24') are attached to layers 16 (16') so that batteries 26 (26') and switches 28 (28') complete a d.c. current whereby current can be made to flow through strips 16 (16') by closure of switches 28 (28'). A variable source of voltage 30 (30') is connected to strips via leads 32 (32') and 34 (34') to supply a variable current to strips 20 (20'). A variable current source 15 is connected to the strips 12 and 8 as shown through leads M and N. The entire unit of FIG. 1 is placed in a refrigerator and maintained at a temperature T≅1.7° K.

Figure 4:
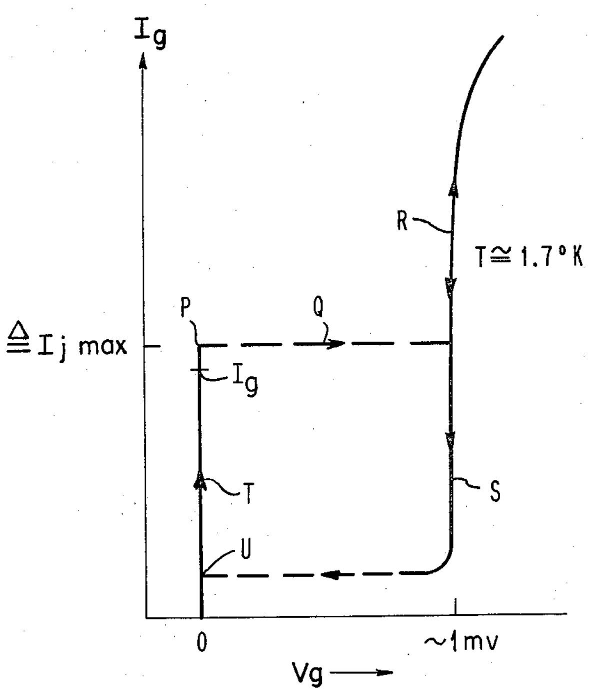
FIG. 4 is an I-V characteristic of a Josephson junction using a constant current source.

FIG. 4 shows a typical I-V plot for a single conventional Josephson junction of Sn–SnO–Sn of the dimensions set forth hereinabove. As current is increased from zero to a value just below 32 milliamperes there is no voltage drop across the barrier region. However, when the current reaches the critical value and the current is held constant, the voltage drop $V_g$ across the barrier increases to a value ~ 1.1 millivolts. The value of 32 ma. represents the maximum current $I_{J\overline{max}}$ that can be supported in the zero-voltage state. In other words, at point P, Cooper pair tunneling is replaced by single electron tunneling and tunneling through the Josephson junction follows along the path Q, producing a voltage drop of approximately 1.1 mv.

If the current is further increased, line R is followed. As the current is now decreased, lines R and S are followed to U.

The critical current $I_{J\overline{max}}$ through a single junction can be changed by application of a magnetic field to that junction. In the description that follows, the orientation of the magnetic fields will always be as shown in FIG. 1.

Figure 5:
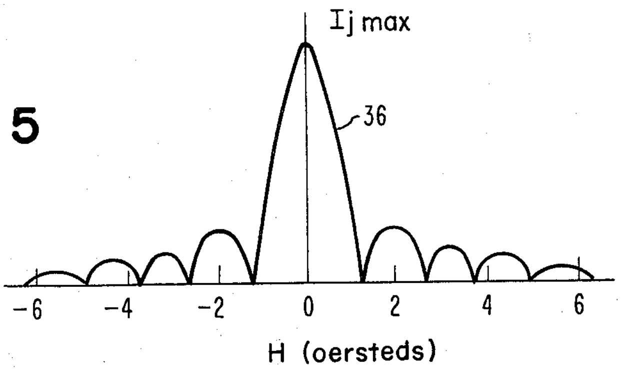
FIG. 5 is a plot of critical tunneling current as a function of magnetic field where $\lambda_J >> L$.
Figure 6:
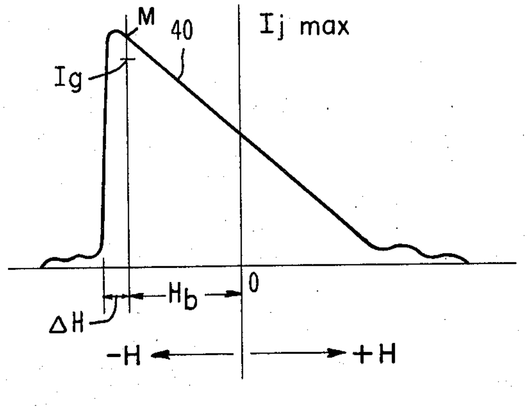
FIG. 6 is a plot of current as a function of magnetic field where $\lambda_J >> L$.

The functional form of $I_{J\,max}(H)$ or, equivalently, $I_{J\,max}$ ($I_b$ or $I_c$), where $I_b$ and $I_c$ are respectively bias and control currents in strip 16 and strip 20, depends upon the ratio of $\lambda_J/L$, where $\lambda_J$ is the penetration depth of the magnetic field into a barrier region 10. If $\lambda_J << L$, $$I_{J_{\overline{max}}}(H) = I_{J\overline{max}}(I_b) = I_{J\overline{max}}(I_c)$$

and has the characteristics shown in FIG. 6. For example, if $L/\lambda_J$ is at least 5, the linear gain curve of FIG. 6 will be obtained. If $\lambda_J >> L$, then $$I_{J_{max}}(H) = I_{J_{max}}(I_c) = I_{J_{max}}(I_b)$$

and has the form shown in FIG. 5.

The gist of this invention relates to the means of obtaining the functional form (See curve 40) of FIG. 6 so that large current gains can be obtained in logic, memory, etc. circuits using such means. Both $\lambda_J$ and L are under control of the fabricator of the junction, wherein L is obviously more controllable than $\lambda_J$. However, $\lambda_J$ is proportional to $(1/R_{NN})^{-1/2}$, where $R_{NN}$ is the normal resistance of the Josephson junction measured at a temperature of interest. $R_{NN}$, in turn is proportional to the barrier 10 thickness which is controlled during fabrication and which can be made such that $\lambda_J << L$. By the same token, for any $\lambda_J$, L can be made sufficiently large so that the above relationship $\lambda_J << L$ is satisfied.

To indicate how gain is achieved, assume that the I-V characteristics shown in FIG. 6 pertains to what follows. As seen in FIG. 32, a current $I_{b\,1}$ flows through strip 20 and a second flow of current $I_{b\,2}$ flows through strip 20' so that $I_{J\overline{max}_1}(I_{b_1})$ of junction 1 $\cong J_{\overline{max}_2}(I_{b_2})$ of junction 2=value M (see FIG. 6). A current of value $I_g$ is supplied by current source 15 to strips 12 and 8 forming the first junction as well as to strips 12' and 8' forming the second junction. $I_g$ is chosen to be equal to M− ε, where ε≅1mA.

Assume that current of value $I_g$ is initially flows through junction 1 in the manner shown in FIG. 3B. The starting conditions of the two junctions are such that the time $t_0$, junction 1 carries a current equal to $I_g$ and junction 2 carries a current of 0. The current through junction 2 begins at an initial zero stage as shown in FIG. 3C. The switching operation is initiated by a small current $I_{c\,1}$≅2mA having the same polarity as $I_{b_1}$. This current $I_{c_1}$ results in $I_{J\,max_1}(I_{b_1} + I_{c_1})$ being approximately M. Junction 1 switches along path V to point W (FIG. 3*b*) and the current $I_g$ transfers to device 2. The end condition is such that current in junction 1 is now zero and current in junction 2 is $I_g$. For instance, a current $I_{c\,1}$≅2mA can control a current $I_g$≅64mA in junction 2, yielding a current gain of ~ 32. Obviously, current $I_g$ now flowing through the second junction can be made to switch back to the first junction by applying a suitable control current through strip 20'.

It should be understood that it is not critical to the practice of this invention as to the manner in which the Josephson junction and accompanying bias and control strips are deposited or constructed, so long as the value of the penetration depth $\lambda_J$ is much less than the length of the barrier layer forming the Josephson junction, and the magnetic fields applied by currents in strips 16 (or 16') and 20 (or 20') are applied perpendicular to this barrier layer.

While the invention has been particularly shown and described with reference to a preferred embodiment thereof, it will be understood by those skilled in the art that various changes in form and details may be made therein without departing from the spirit and scope of the invention.

What is claimed is:

1. A Josephson junction tunneling device having two superconductive strips overlapping each other by a common length L, a potential barrier layer interposed between said strips, means for applying a magnetic field to said junction, said length L being at least five times the Josephson penetration depth $\lambda_J$ of said magnetic field into said junction.

2. The Josephson junction of claim 1 wherein the barrier layer is the oxide of one of the superconductive strips.

3. The Josephson junction of claim 1 wherein the supercondcutive strips are tin.

4. A Josephson junction tunneling device capable of assuming a zero-voltage conduction state and a voltage conducting state having two superconductive strips overlapping each other by a common length L, a potential barrier layer interposed between said strips, said length being significantly greater than the penetration depth J of said magnetic field into said junction, means for applying a magnetic bias field to said junction which is close to but insufficient to switch said junction to its voltage conduction state, and a second magnetic field means capable, when actuated, of being additive to said magnetic bias means so as to switch said junction to its voltage conduction state.

5. A Josephson tunneling device having two superconductive strips overlapping each other by a common length L, a potential barrier layer interposed between said strips, a ground plane insulated from said Josephson tunneling device, means for applying a magnetic field to said junction, said length L being significantly greater than the penetration depth $\lambda_J$of said magnetic field into said barrier layer.

6. The Josephson device of claim 5, wherein said length L is at least about five times said penetration depth.

7. The Josephson device of claim 5 wherein said barrier layer is an oxide of one of the superconductive strips.

8. The Josephson device of claim 5 wherein said superconductive strips are comprised of tin.

9. The Josephson device of claim 5 wherein said superconductive strips are comprised of lead.

10. The Josephson device of claim 8, wherein the self-magnetic field created by Josephson tunneling current is in substantially the same direction as said applied magnetic field.

11. A Josephson tunneling device having a zero-voltage conduction state and a voltage conduction state, said Josephson device being comprised of two superconductive electrodes overlapping each other by a common length L, a potential barrier layer interposed between said electrodes, a ground plane insulated from said superconducting electrodes, first means for applying a first magnetic field to said Josephson device, and a second magnetic field means capable, when actuated, of producing a magnetic field which is additive to said first magnetic field for switching said Josephson tunneling device to its voltage conduction state, wherein said length L is significantly greater than the penetration depth $\lambda_J$ of magnetic fields into said potential barrier layer.

12. The Josephson device of claim 14, wherein the self-magnetic field produced by Josephson tunneling current through the device is in substantially the same direction as said first magnetic field.

13. A circuit including two parallel current-carrying legs connected by a wholly superconductive path and including means for switching current from one leg to the other leg, the improvement comprising a Josephson tunneling device in each leg as the switching element, each said Josephson tunneling device being comprised of a potential barrier region located between superconductive elements, said elements overlapping by a common length L wherein the length L of each tunneling device is much greater than the penetration depth $\lambda_J$ of magnetic fields into said potential barrier regions.

14. The flip-flop circuit of claim 13 wherein the length L of each device is at least about five times greater than said penetration depth.

15. A Josephson tunneling device exhibiting a Josephson current, comprising:

superconductive elements for carrying electrons to and from said device, said elements overlapping each other by a common length L;

a potential barrier region located between said elements, said region being a potential barrier to electron flow between said elements;

current means connected to said elements for providing electrons, a ground plane insulated from said superconductive elements, means applying magnetic flux of varying magnitude to said device, said magnetic flux having a penetration depth $\lambda_J$ into said potential barrier region, wherein the ratio $L/\lambda_J$ is such that the maximum Josephson current through said device is a substantially linear function of said magnitude flux over a range of said applied flux magnitude.

16. The device of claim 15, wherein the length L is at least approximately five times $\lambda_J$.

17. The device of claim 15, where the magnetic fields produced by said Josephson current is in a direction approximately the same as the direction of said applied magnetic flux.

18. The device of claim 15, wherein said potential barrier region is an oxide of one of said elements.

19. The device of claim 15, wherein said superconductive elements are comprised of lead.

20. A circuit including two parallel current-carrying legs connected by a wholly superconductive path and including means for switching current from one leg to the other leg, the improvement comprising a Josephson tunneling device in each leg as a switching element, each said Josephson device being comprised of a potential barrier region located between superconductive elements wherein said elements overlap by a length L, and means for applying magnetic flux to each said Josephson device, said magnetic flux having a penetration depth $\lambda_J$ into said potential barrier region, wherein the ratio $L/\lambda_J$ is such that the maximum Josephson current through said Josephson devices is a substantially linear function of said magnetic flux over a range of said magnetic flux amplitude.

21. A Josephson tunneling device exhibiting a Josephson tunneling current and having a substantially linear relationship between maximum Josephson current through said device and the amplitude of a magnetic field penetrating said device, comprising:

first and second electrodes which overlap each other by a length L, a potential barrier region located between said first and second electrodes sufficiently thin that said Josephson current can tunnel therethrough, wherein said magnetic field penetrates said potential barrier to a depth $\lambda_J$, the ratio $L/\lambda_J$ being sufficiently large that said substantially linear relationship between maximum Josephson current through said device and the amplitude of said magnetic field penetrating said device is obtained.

22. The device of claim 21, wherein said potential barrier is an insulating layer.

23. The device of claim 21, where said potential barrier is comprised of an oxide of one of said electrodes.

24. The device of claim 21, where at least one of said electrodes is comprised of lead.

25. The device of claim 21, including means for producing said magnetic field.

26. The device of claim 21, where said ratio $L/\lambda_J$ is at least about five.

27. The device of claim 5, where said potential barrier layer has a length approximately L.

28. The device of claim 15, where said potential barrier region has a length approximately L.

29. The device of claim 21, where said potential barrier region has a length approximately L.

* * * * *

UNITED STATES PATENT OFFICE
CERTIFICATE OF CORRECTION

Patent No. 3,803,459 Dated April 9, 1974

Inventor(s) Juri Matisoo

It is certified that error appears in the above-identified patent and that said Letters Patent are hereby corrected as shown below:

On the cover sheet [73] "General Instrument Corporation, Newark, N. J." should read -- International Business Machines Corporation, Armonk, N. Y. --. In the Abstract, line 7, "$\Lambda_J$" should read --$\lambda_J$ --. Column 2, line 31, "$\lambda_J >> L$" should read --$\lambda_J << L$ --; line 39, "FIG.2" should read -- FIG. 2) --. Column 3, line 60, "FIG. 32" should read -- FIG. 3a --; line 62, "$\cong J_{max_2} (I_{b_2})$" should read -- $\cong I_{J_{max_2}} (I_{b_2})$ --; line 1, "$I_g$ is initially" should read -- $I_g$ initially --; line 4, "that the time" should read -- that at the time --; line 7, "FIG. 3C" should read -- FIG. 3c --; line 54, "conducting" should read -- conduction --; line 59, "J" should read -- $\lambda_J$ --. Column 6, line 16, "magnitude" should read -- magnetic --; line 20, "fields" should read -- field --.

Signed and sealed this 5th day of November 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
U.S. GOVERNMENT PRINTING OFFICE 869-930